United States Patent
Kotani

(10) Patent No.: US 9,324,902 B2
(45) Date of Patent: Apr. 26, 2016

(54) SEMICONDUCTOR LIGHT-EMITTING ELEMENT

(71) Applicant: Sharp Kabushiki Kaisha, Osaka-shi, Osaka (JP)

(72) Inventor: Teruhisa Kotani, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/410,119

(22) PCT Filed: Jul. 11, 2013

(86) PCT No.: PCT/JP2013/068938
§ 371 (c)(1),
(2) Date: Dec. 22, 2014

(87) PCT Pub. No.: WO2014/017303
PCT Pub. Date: Jan. 30, 2014

(65) Prior Publication Data
US 2015/0194568 A1    Jul. 9, 2015

(30) Foreign Application Priority Data
Jul. 26, 2012    (JP) ................. 2012-165784

(51) Int. Cl.
*H01L 33/00* (2010.01)
*H01L 33/12* (2010.01)
(Continued)

(52) U.S. Cl.
CPC ............. *H01L 33/0025* (2013.01); *B82Y 20/00* (2013.01); *H01L 33/06* (2013.01); *H01L 33/12* (2013.01); *H01L 33/32* (2013.01); *H01S 5/34333* (2013.01); *H01S 2301/173* (2013.01)

(58) Field of Classification Search
CPC ..... H01L 33/0025; H01L 33/06; H01L 33/12; H01L 33/32; H01S 5/34333; H01S 2301/173; B82Y 20/00
USPC .................. 257/13, 14, 43, 79, 96, 101, 103, 257/E33.005, E33.008, E33.013, E33.025, 257/E21.09, E21.585; 372/44.011, 45.01; 438/35, 46, 48, 478
See application file for complete search history.

(56) References Cited

U.S. PATENT DOCUMENTS

| 5,777,350 A | 7/1998 | Nakamura et al. |
| 6,233,265 B1 | 5/2001 | Bour et al. |

(Continued)

FOREIGN PATENT DOCUMENTS

| JP | 02-229475 A | 9/1990 |
| JP | 10-117016 A | 5/1998 |

(Continued)

OTHER PUBLICATIONS

Official Communication issued in International Patent Application No. PCT/JP2013/068938, mailed on Sep. 17, 2013.

(Continued)

*Primary Examiner* — Dao H Nguyen
(74) *Attorney, Agent, or Firm* — Keating & Bennett, LLP

(57) ABSTRACT

A semiconductor light-emitting element according to the present invention includes an $In_{(X0)}Ga_{(1-X0)}N$ ($0.25 \leq X \leq 0.35$) template and a quantum well active layer containing $Al_{(X2)}In_{(Y2)}Ga_{(1-X2-Y2)}N$ ($0 \leq X2 \leq 1$, $0 \leq Y2 \leq 1$) as a well layer.

6 Claims, 9 Drawing Sheets

(51) Int. Cl.
*H01L 27/15* (2006.01)
*H01L 33/32* (2010.01)
*H01L 33/06* (2010.01)
*H01S 5/343* (2006.01)
*B82Y 20/00* (2011.01)

(56) References Cited

U.S. PATENT DOCUMENTS

| | | | |
|---|---|---|---|
| 6,285,696 B1 | 9/2001 | Bour et al. | |
| 6,345,063 B1 | 2/2002 | Bour et al. | |
| 7,247,884 B2 * | 7/2007 | Shibata et al. | 257/79 |
| 2002/0179923 A1 * | 12/2002 | Morita et al. | 257/103 |
| 2003/0020085 A1 * | 1/2003 | Bour et al. | 257/101 |
| 2010/0012969 A1 * | 1/2010 | Yoon et al. | 257/99 |
| 2010/0108985 A1 * | 5/2010 | Chung et al. | 257/13 |
| 2011/0062415 A1 | 3/2011 | Ohta et al. | |
| 2011/0064103 A1 | 3/2011 | Ohta et al. | |
| 2011/0261849 A1 | 10/2011 | Shinagawa et al. | |
| 2013/0003769 A1 * | 1/2013 | Kumano et al. | 372/45.01 |
| 2015/0076537 A1 * | 3/2015 | Chou et al. | 257/96 |

FOREIGN PATENT DOCUMENTS

| | | |
|---|---|---|
| JP | 11-261108 A | 9/1999 |
| JP | 2000-058920 A | 2/2000 |
| JP | 2003-069156 A | 3/2003 |
| JP | 2009-246005 A | 10/2009 |
| JP | 2010-056434 A | 3/2010 |
| JP | 2011-205076 A | 10/2011 |
| WO | 2011/022724 A1 | 2/2011 |

OTHER PUBLICATIONS

Avramescu et al., "True Green Laser Diodes at 524 nm with 50 mW Continuous Wave Output Power on c-Plane GaN," The Japan Society of Applied Physics Express 3, 2010, pp. 061003-1 to 061003-3.

* cited by examiner (a)

(b)

(c)

(d)

(a)

(b)

SEMICONDUCTOR LIGHT-EMITTING ELEMENT

TECHNICAL FIELD

The present invention relates to a semiconductor light-emitting element made from a nitride.

BACKGROUND ART

Ultraviolet-blue-green light-emitting elements by using an InGaN quantum well active layer have been previously realized by nitride semiconductors. The band gap of InGaN can be changed from an ultraviolet region (3.4 eV) to a near-infrared region (0.7 eV) by changing the In composition. At present, as disclosed in, for example, A. Avramescu, T. Lermer, J. Muller, C. Eichler, G. Bruederi, M. Sabathil, S. Lutgen and U. Strauss, Appl. Phys. Exp 3 061003 (2010) (NPL 1), the maximum wavelength of a nitride semiconductor laser is 531 nm (blue-green). Also, Japanese Unexamined Patent Application Publication No. 2009-246005 (PTL 1) discloses a method for improving the light emission characteristics of a semiconductor laser diode in such a long wavelength region by using a ZnO single crystal substrate.

CITATION LIST

Patent Literature

PTL 1: Japanese Unexamined Patent Application Publication No. 2009-246005

Non Patent Literature

NPL 1: A. Avramescu, T. Lermer, J. Muller, C. Eichler, G. Bruederi, M. Sabathil, S. Lutgen and U. Strauss, Appl. Phys. Exp 3 061003 (2010)

SUMMARY OF INVENTION

Technical Problem

In recent years, from the viewpoint of energy conservation and reduction in the environmental load and, furthermore, for the purpose of realizing light sources for high-resolution display and high-density optical recording, development of semiconductor laser diodes and semiconductor light-emitting diodes, which emit light with a high efficiency in a region of wavelengths longer than the wavelength of blue-green, has been intensely desired.

In this regard, the semiconductor laser diode disclosed in NPL 1 realizes a blue-green (531 nm) laser diode by an InGaN quantum well active layer which is formed on a C-plane GaN substrate and which has an In composition of about 30%.

In order to realize a light-emitting element with a longer wavelength, further reduction in the band gap, that is, further increase in the In composition of the InGaN quantum well active layer is necessary. However, if the In composition increases, the band gap may rather increases due to strain in the quantum well active layer resulting from lattice mismatch between the GaN substrate and the InGaN quantum well active layer, and further increase in the wavelength has not been achieved.

Meanwhile, if the In composition is about 30% or more, as the In composition increases, the luminous efficacy decreases because of a piezoelectric field resulting from lattice mismatch between the GaN substrate and the InGaN quantum well active layer. Therefore, it has been difficult to realize a semiconductor laser diode with a wavelength longer than the wavelength of blue-green.

Also, in the first place, if the In composition increases, a crystal of InGaN cannot be grown stably and, therefore, it has been difficult to obtain InGaN having sufficient crystal quality.

On the other hand, light-emitting diodes up to amber (570 nm) have been realized, although in the region of wavelengths longer than the green region, the luminous efficacy tends to decrease sharply, and a highly efficient light-emitting diode has not been realized.

In this regard, in the semiconductor laser diode disclosed in PTL 1, an InGaN template lattice-matched to a ZnO single crystal substrate is used and strain in the InGaN quantum well active layer in a region of wavelengths longer than the wavelength of blue (In composition>10%) is reduced.

However, even the technology disclosed in PTL 1 cannot suppress the decrease in the luminous efficacy because of a piezoelectric field resulting from lattice mismatch between the substrate and the InGaN quantum well active layer in the region in which the In composition is about 30% or more. Therefore, it is difficult to realize a light-emitting element with a wavelength longer than the wavelength of green (550 nm).

Also, the crystal growth temperature of InGaN in a common mass-production process is 700° C. or higher. The ZnO single crystal substrate used in PTL 1 has a high Zn vapor pressure and, therefore, is decomposed on the occasion of being heated to 700° C. or higher, so that a flat surface cannot be obtained. Consequently, in consideration of the mass-productivity, PTL 1 do not provide a sufficient solving measure.

The present invention has been made in light of the present situation and the object thereof is to obtain an InGaN quantum well active layer exhibiting high luminous efficacy and having a high In composition and, in addition, to provide a semiconductor laser diode allowed to lase in a region of wavelengths longer than the wavelength of green and a semiconductor light-emitting diode which emits light in a region of wavelengths longer than the wavelength of green, that is, a semiconductor light-emitting element which emits light with a high efficiency in a region of wavelengths longer than the wavelength of green.

Solution to Problem

A semiconductor light-emitting element according to the present invention is a semiconductor light-emitting element allowed to lase in a long-wavelength region (green to red), where in a light-emitting region with wavelengths longer than the wavelength of green, strain and piezoelectric field in an InGaN quantum well active layer are reduced and the luminous efficacy is improved considerably by using InGaN, which holds the state corresponding to InGaN having the In composition of 25% or more, as a light-emitting element active layer.

That is, a semiconductor light-emitting element according to the present invention includes an $In_{(X0)}Ga_{(1-X0)}N$ ($0.25 \leq X0 \leq 0.35$) template and a quantum well active layer containing $Al_{(X2)}In_{(Y2)}Ga_{(1-X2-Y2)}N$ ($0 \leq X2 \leq 1$, $0 \leq Y2 \leq 1$) as a well layer.

In the case where the above-described configuration is provided, in a region with wavelengths longer than the wavelength of green, strain in a quantum well active layer and a piezoelectric field are reduced, so that high-quality crystal can be obtained and, in addition, a quantum well structure having high radiative recombination probability and gain can be formed.

Also, it is preferable that an $Al_{(X1)}In_{(Y1)}Ga_{(1-X1-Y1)}N$ ($0 \leq X1 \leq 1$, $0 \leq Y1 \leq 1$) lower clad layer lattice-matched to the template be further included between the template and the quantum well active layer and an $Al_{(X3)}In_{(Y3)}Ga_{(1-X3-Y3)}N$ ($0 \leq X3 \leq 1$, $0 \leq Y3 \leq 1$) upper clad layer lattice-matched to the template be further included on the quantum well active layer.

In the case where the above-described configuration is provided, generated carriers can be confined in the quantum well active layer efficiently and, thereby, a light-emitting element exhibiting high luminous efficacy can be realized.

Also, it is preferable that the template include a (111) spinel substrate or an $In_{(X0)}Ga_{(1-X0)}N$ ($0.25 \leq X0 \leq 0.35$) single crystal substrate as a base and, in addition, include an $In_{(X0)}Ga_{(1-X0)}N$ ($0.25 \leq X0 \leq 0.35$) layer lattice-matched to the substrate.

In the case where the above-described configuration is provided, an epitaxial wafer can be formed by common techniques, e.g., a metal organic vapor phase epitaxial method and a molecular beam epitaxial method, and this is preferable from the viewpoint of the mass-productivity.

It is preferable that the X0 satisfies the relationship of $0.30 \leq X0 \leq 0.32$.

In the case where the above-described relationship is satisfied, the $In_{(X0)}Ga_{(1-X0)}N$ template is lattice-matched to the (111) spinel single crystal substrate, so that a high-quality $In_{(X0)}Ga_{(1-X0)}N$ template can be realized.

Also, it is preferable that the X0 and the Y2 satisfy the relationship of $0.05 \leq Y2-X0$.

In the case where the above-described relationship is satisfied, band mixing of the valence band due to the strain can be weakened and, in addition, a gain and a TE-polarized component based on the spontaneous emission probability can be increased. Therefore, high-performance semiconductor laser diode and semiconductor light-emitting diode can be realized.

Also, it is preferable that the X0 and the Y2 satisfy the relationship of $Y2-X0 \leq 0.10$.

In the case where the above-described relationship is satisfied, the piezoelectric field in the quantum well active layer is screened by carriers, so that a high-performance semiconductor laser diode can be realized.

Also, it is preferable that an $Al_{(X4)}In_{(Y4)}Ga_{(1-X4-Y4)}N$ ($0 \leq X4 \leq 1$, $0 \leq Y4 \leq 1$) lower contact layer lattice-matched to the template between the template and the lower clad layer, an $Al_{(X5)}In_{(Y5)}Ga_{(1-X5-Y5)}N$ ($0 \leq X5 \leq 1$, $0 \leq Y5 \leq 1$) lower guide layer between the lower clad layer and the quantum well active layer, and an $Al_{(X6)}In_{(Y6)}Ga_{(1-X6-Y6)}N$ ($0 \leq X6 \leq 1$, $0 \leq Y6 \leq 1$) upper current blocking layer and an $Al_{(X7)}In_{(Y7)}Ga_{(1-X7-Y7)}N$ ($0 \leq X7 \leq 1$, $0 \leq Y7 \leq 1$) upper guide layer between the quantum well active layer and the upper clad layer be included, wherein an $Al_{(X8)}In_{(Y8)}Ga_{(1-X8-Y8)}N$ ($0 \leq X8 \leq 1$, $0 \leq Y8 \leq 1$) upper contact layer be further included on the upper clad layer.

In the case where the above-described configuration is provided, it is possible to confine light carriers in the vicinity of the quantum well active layer efficiently and, furthermore, ohmic contact with an electrode is facilitated, so that a high-performance semiconductor laser diode can be realized.

Advantageous Effects of Invention

The semiconductor light-emitting element according to the present invention can reduce strain in the inside of an InGaN active layer and piezoelectric field in a region with wavelengths longer than the wavelength of green and, in addition, exhibits very high luminous efficacy. Also, a very large gain is obtained and, therefore, lasing is possible in a long wavelength region (that is, green to red region).

DESCRIPTION OF EMBODIMENTS

Figure 1:
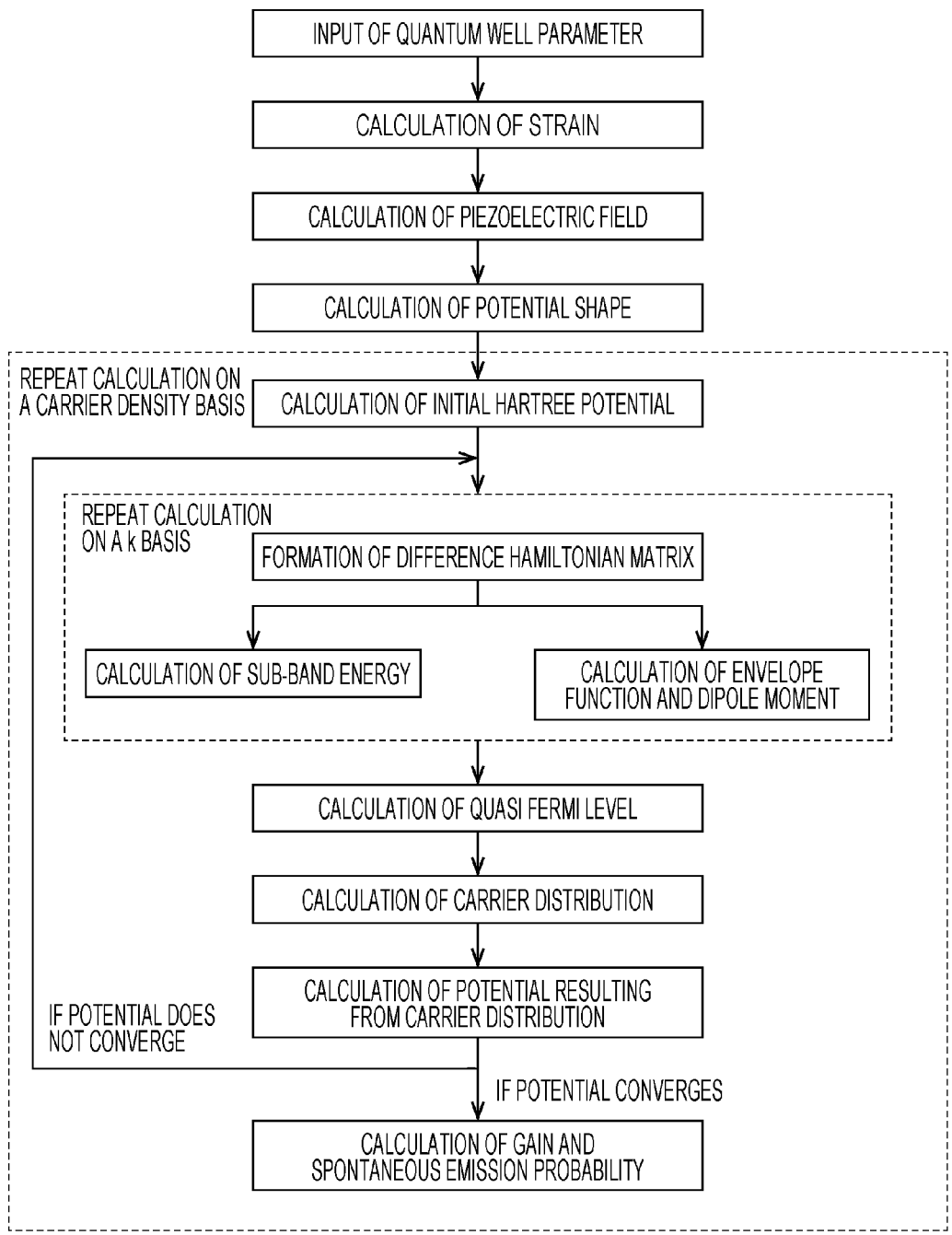
FIG. 1 is an example of flow chart showing the theoretical calculation procedure of the gain and the spontaneous emission probability.

The embodiments according to the present invention will be described below in further detail.

First Embodiment

A semiconductor laser diode 1 which is a first embodiment according to the present invention will be described below.

<Element Configuration>

The configuration of the semiconductor laser diode 1 will be described with reference to FIG. 9. The semiconductor laser diode 1 includes a (111) spinel ($MgAl_2O_4$) substrate 10, an InGaN template 11 which is formed on the spinel single crystal substrate 10 and which has an In composition lattice-matched to the spinel single crystal substrate 10, an AlInGaN lower contact layer 12 formed on the template 11 and lattice-matched to the template 11, an AlInGaN lower clad layer 13 formed on the lower contact layer 12, an AlInGaN lower guide layer 14 formed on the lower clad layer 13, an AlInGaN quantum well active layer 15 formed on the lower guide layer 14, an AlInGaN current blocking layer 16 formed on the quantum well active layer 15, an AlInGaN upper guide layer 17 formed on the current blocking layer 16, an AlInGaN upper clad layer 18 formed on the upper guide layer 17, and an AlInGaN upper contact layer 19 formed on the upper clad layer 18.

<Template>

The template 11 is a base substrate for the individual layers to be formed thereon and is formed on the (111) spinel single crystal substrate 10. In this regard, the film thickness of the template 11 containing $In_{(X0)}Ga_{(1-X0)}N$ is preferably 0.5 µm or more and 7 µm or less, more preferably 2 µm or more and 6 µm or less, and most preferably 3 µm or more and 5 µm or less. Meanwhile, as for the In composition, in order to lattice-match to the (111) spinel single crystal substrate 10, $0.25 \leq X0 \leq 0.35$ is preferable, $0.27 \leq X0 \leq 0.33$ is more preferable, and $0.30 \leq X0 \leq 0.32$ is most preferable. From the viewpoint of lattice match, $In_{0.31}Ga_{0.69}N$ (that is, X0=0.31) is particularly preferable.

<Lower Contact Layer>

The lower contact layer 12 is disposed to realize ohmic contact with an n-electrode 20. In this regard, internal strain is preferably minimized, so that $Al_{(X4)}In_{(Y4)}Ga_{(1-X4-Y4)}N$ having a composition adjusted to lattice-match to the template 11 is preferable, and a composition of $In_{0.31}Ga_{0.69}N$ and a film thickness of 50 nm are most preferable.

<Lower Clad Layer>

The lower clad layer 13 is disposed to confine the light generated from carriers and the quantum well active layer 15 efficiently. In this regard, internal strain is preferably minimized, so that $Al_{(X5)}In_{(Y5)}Ga_{(1-X5-Y5)}N$ ($0 \leq X5 \leq 1$, $0 \leq Y5 \leq 1$) having a composition adjusted to maximize lattice match to the template 11 is preferable, and a composition of $In_{0.31}Ga_{0.69}N$ and a film thickness of 1 μm are most preferable.

<Lower Guide Layer>

The lower guide layer 14 is disposed to confine the light in cooperation with the lower clad layer 13. In this regard, the light is confined into the lower guide layer 14 side by forming the lower guide layer 14 in such a way as to have a refractive index higher than the refractive index of the lower clad layer 13. In order to obtain a refractive index higher than the refractive index of the lower clad layer 13, it is preferable that the thin film have an In composition higher than the In composition of the lower clad layer 13, and a composition of $In_{0.35}Ga_{0.65}N$ and a film thickness of about 200 nm are preferable.

<Quantum Well Active Layer>

The quantum well active layer 15 is a layer to generate light on the basis of radiative recombination of electrons and holes and has a configuration in which InGaN barrier layers 152 are formed on both sides of the InGaN well layer 151. The emission wavelength is changed depending on the In composition, the strain, and the film thickness and, therefore, it is necessary that appropriate values be selected in accordance with the predetermined emission wavelength.

Figure 11:
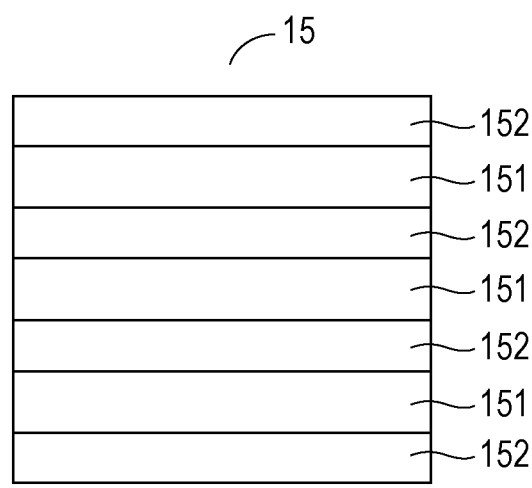
FIG. 11 is a schematic conceptual diagram showing an example of a quantum well active layer of a semiconductor light-emitting element.

In the present first embodiment, the In composition shown in Table 1 is used. Also, the width of the barrier layer 152 is specified to be 6 nm, and the width of the well layer 151 is specified to be 3 nm. The case where only one layer of this well layer 151 is included may be referred to as a single-quantum well structure (SQW). A structure in which, for example, the barrier layer 152, the well layer 151, the barrier layer 152, the well layer 151 are stacked sequentially and, thereby, a plurality of well layers 151 are included may be referred to as a multiple-quantum well structure (MQW). Here, as shown in FIG. 11, the multiple-quantum well structure including three well layers 151 in total is employed.

<Current Blocking Layer>

The current blocking layer 16 is disposed to block electrons overflowed from the quantum well active layer 15. In order to block electrons, InGaN having a band gap higher than the band gap, that is, an In composition lower than the In composition, of the barrier layer 152 is preferable. The In composition in the current blocking layer 16 is preferably about 0.05 smaller than the In composition in the barrier layer 152 shown in Table 1 and the thickness is preferably 10 nm.

<Upper Guide Layer and Upper Clad Layer>

The upper guide layer 17 and the upper clad layer 18 play the same roles as those of the lower guide layer 14 and the lower clad layer 13, respectively, and are used for confining the light. The In compositions and the film thicknesses of them are preferably the same as those of the lower guide layer 14 and the lower clad layer 13, respectively.

<Upper Contact Layer>

The upper contact layer 19 is disposed to ensure ohmic contact with an electrode. The composition and the film thickness are preferably the same as those of the lower contact layer 12.

<Dopant>

Meanwhile, the lower contact layer 12, the lower clad layer 13, and the lower guide layer 14 are doped having the n-type, and each of the current blocking layer 16, the upper guide layer 17, and the upper clad layer 18 is doped having the p-type. Preferably, the n-type dopant is silicon (Si) and the p-type dopant is magnesium (Mg).

<External Configuration>

Figure 9:
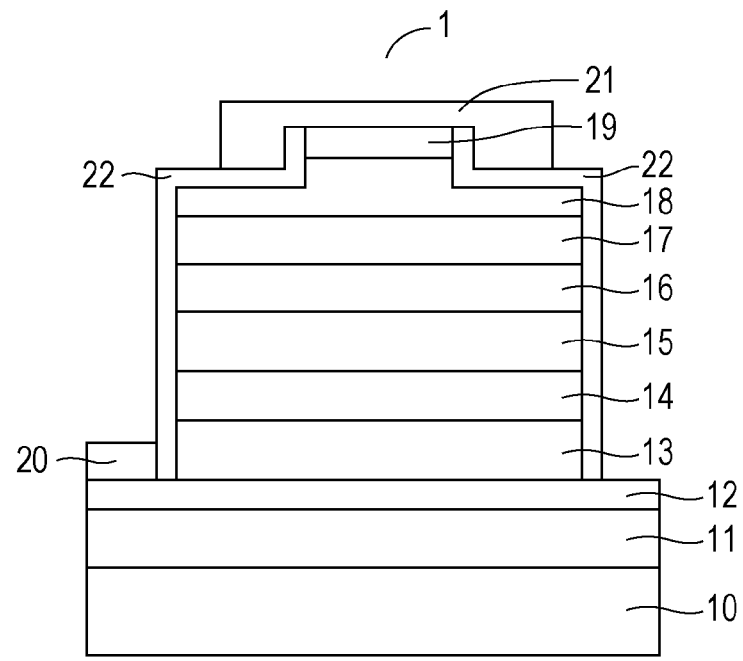
FIG. 9 is a schematic conceptual diagram of a semiconductor laser diode according to the present invention.

The above-described template and individual layers are stacked as shown in FIG. 9, a p-electrode 21 is formed on the contact layer, and the n-electrode 20 is formed on a partly exposed lower contact layer 12. Also, an insulating film 22 of $SiO_2$ or the like is disposed in such a way as to cover the side surfaces of the layers other than the electrodes.

<Lasing Action>

In the above-described semiconductor laser diode 1, when a voltage is applied between the n-electrode 20 and the p-electrode 21, holes are injected from the p-electrode 21 and electrons are injected from the n-electrode 20 toward the quantum well active layer 15, gains are generated in the quantum well active layer, and lasing occurs in the vicinity of the wavelength shown in Table 1.

The above-described configuration (in particular, the compositions and the film thicknesses of the lower contact layer 12, the lower clad layer 13, the lower guide layer 14, the quantum well active layer 15, the current blocking layer 16, the upper guide layer 17, the upper clad layer 18, and the upper contact layer 19) is no more than an example, and an appropriate adjustment may be performed in accordance with a predetermined wavelength and power unless the individual layers exceed critical film thicknesses (critical thickness of occurrences of dislocation and defect).

<Production of Semiconductor Laser Diode>

Next, a method for manufacturing the semiconductor laser diode 1 according to the first embodiment will be described. The epitaxial wafer of the semiconductor laser diode 1 can be grown by using the molecular beam epitaxial method (hereafter may be referred to as MBE) and the metal organic vapor phase epitaxial method (hereafter may be referred to as MOVPE). Each case will be described below with reference to FIG. 9.

<Crystal Growth MBE>

A method for growing the epitaxial wafer of the semiconductor laser diode 1 by employing MBE will be described. Initially, the (111) spinel single crystal substrate 10 is subjected to a surface treatment. As for this surface treatment, a surface planarization treatment and surface cleaning treatment, as described below, can be performed. In the surface planarization treatment, the surface of the (111) spinel single crystal substrate 10 is subjected to a chemical mechanical polishing treatment (hereafter may be referred to as CMP treatment) and a heat treatment is performed in an oxygen atmosphere at a temperature of about 1,000 degrees, so that a step structure can be formed on the surface.

Thereafter, the (111) spinel single crystal substrate 10 is introduced into a growth chamber, and the surface cleaning treatment is performed. In the surface cleaning treatment, a thermal cleaning treatment is performed in the growth chamber under atmospheric pressure or a reduced pressure. Specifically, the (111) spinel single crystal substrate 10 is heated at a temperature of 700° C. to 750° C. for 30 to 60 minutes and, thereby, organic materials and the like can be removed.

Subsequently, a process of growing a nitride semiconductor layer on the surface of the (111) spinel single crystal substrate 10 is executed. The nitride semiconductor layer can be grown by a nitrogen RF radical source MBE method in which a RF radical cell to supply a V group raw material as nitrogen radicals is included.

Then, the growth temperature is set at a temperature lower than 750° C., for example, 400° C. to 600° C., Al, In, Ga, and N serving as raw materials set at a predetermined cell temperature are used, and the template 11, the lower contact layer 12, the lower clad layer 13, the lower guide layer 14, three periods of the InGaN quantum well active layers 15, the current blocking layer 16, the upper guide layer 17, the upper clad layer 18, and the upper contact layer 19 are formed sequentially by supplying the raw material gas on the (111) spinel single crystal substrate 10 while growth temperatures and constituent ratios of the raw material gases are adjusted to the optimums for formation of the individual layers.

In this regard, in growth of the lower contact layer 12, the lower clad layer 13, and the lower guide layer 14, the individual layers are allowed to have the n-type conductivity by being doped with silicon (Si).

Also, in growth of the current blocking layer 16, the upper guide layer 17, the upper clad layer 18, and the upper contact layer 19, the individual layers are allowed to have the p-type conductivity by being doped with magnesium (Mg). In this regard, as for the p-type dopant, beryllium (Be), co-doping with magnesium (Mg) and silicon (Si), and the like can be favorably employed (p-type co-doping) in place of magnesium (Mg).

Also, in the above-described step, as for the nitrogen plasma condition, for example, a plasma electric power of 300 to 500 W and a nitrogen (N2) gas flow rate of 1.0 to 5.0 sccm (standard cc/min) can be adopted.

Also, after the epitaxial growth and taking out of the growth chamber or vacuum, it is possible to activate Mg and, in addition, allow the layer doped with Mg to have the p-type conductivity by performing a heat treatment at a high temperature.

According to the above-described process, the epitaxial wafer of the semiconductor laser diode 1 is formed.

<Crystal Growth MOVPE>

A method for growing the epitaxial wafer of the semiconductor laser diode 1 by employing MOVPE will be described. Initially, the (111) spinel single crystal substrate 10 is subjected to a surface treatment. As for this surface treatment, a surface planarization treatment and a surface cleaning treatment, as described below, are performed. In the surface planarization treatment, the surface of the (111) spinel single crystal substrate 10 is subjected to the CMP treatment and a heat treatment is performed in an oxygen atmosphere at a temperature of about 1,000° C., so that a step structure can be formed on the surface.

Thereafter, (111) spinel single crystal substrate 10 is introduced into a growth chamber, and the surface cleaning treatment is performed. In the surface cleaning treatment, a thermal cleaning treatment is performed in the growth chamber under atmospheric pressure or a reduced pressure. Specifically, the (111) spinel single crystal substrate 10 is heated in a hydrogen atmosphere at a temperature of 1,000 to 1,100 degrees for 30 to 60 minutes and, thereby, organic materials and the like can be removed.

Subsequently, the growth temperature is set at, for example, 600° C. to 800° C., TMG (trimethylgallium), TMIn (trimethylindium), TMA (trimethylaluminum), and ammonia are used as raw material gases, and the template 11, the lower contact layer 12, the lower clad layer 13, the lower guide layer 14, three periods of the InGaN quantum well active layers 15, the current blocking layer 16, the upper guide layer 17, the upper clad layer 18, and the upper contact layer 19 can be formed sequentially while growth temperatures and constituent ratios of the raw material gases are adjusted to the optimums for formation of the individual layers.

In growth of the lower contact layer 12, the lower clad layer 13, and the lower guide layer 14, the individual layers are allowed to have the n-type conductivity by supplying a silane gas ($SiH_4$) in addition to the above-described raw material gases.

Also, in growth of the current blocking layer 16, the upper guide layer 17, the upper clad layer 18, and the upper contact layer 19, the individual layers are allowed to have the p-type conductivity by supplying cyclopentadienylmagnesium ($Cp_2Mg$) in addition to the above-described raw material gases.

After the epitaxial growth, it is possible to activate Mg and, in addition, allow the layer doped with Mg to have the p-type conductivity by performing a heat treatment in a nitrogen atmosphere in the growth chamber.

According to the above-described process, the epitaxial wafer of the semiconductor laser diode 1 is formed.

<Back End Processes>

The epitaxial wafer formed as described above is taken out of a reaction vessel. As shown in FIG. 9, selective etching is performed from the upper contact layer 19 to expose the surface of the lower contact layer 12, and stripe-shaped n-electrode 20 and p-electrode 21 are formed on the exposed lower contact layer 12 and the upper contact layer 19 surface, respectively.

Subsequently, the (111) spinel single crystal substrate 10 side of the wafer is polished to 80 μm by using a polisher and, thereafter, the wafer is placed on a table of a scriber to form a scribe line. After the scribe line is formed, the wafer is pressed and cracked with a roller, so that a bar having a divided surface orthogonal to the stripe-shaped electrodes is obtained.

Then, a reflection mirror 23 (not shown in the drawing) made from a dielectric multilayer film is formed on the divided surface of the above-described bar by using a CVD apparatus, so that a resonant surface is formed. Furthermore, the substrate side of the bar is scribed at a position parallel to the electrode and, thereafter, the bar is cracked, so that the semiconductor laser diode 1 having a cavity length of 1 mm and a width of 500 μm is formed.

<Theoretical Evaluation of Luminous Efficacy>
<Calculation Result of Gain>

For the purpose of examining an influence of the amount of strain of the InGaN active layer on the laser characteristics, theoretical calculations of the optical gain and the spontaneous emission probability were performed as described below.

FIG. 1 shows the outline of theoretical calculation. The calculation in each step can be performed on the basis of the contents described in, for example, "S. L. Chuang and C. S. Chang, Semicond. Sci. Technol 12, 252 (1997)" (hereafter may be referred to as "Chuang et al.") and "J. Piprek et al. Nitride Semiconductor Devices: Principles and Simulation, Willey (2007)".

In the calculation, an InGaN quantum well structure was assumed to be the quantum well active layer and a model in which InGaN barrier layers having an In composition larger than the In composition of the well layer were formed on both sides of the InGaN well layer was utilized. Calculation of the gain and the spontaneous emission probability at each carrier density were calculated following the procedure shown in FIG. 1, where the carrier density in the quantum well was changed.

In this regard, single-band effective mass Hamiltonian was used as the Hamiltonian of electron and six-band k·p Hamiltonian was used as the Hamiltonian of hole. In the calculation, in consideration of the strain and the piezoelectric field, screening of the piezoelectric field by the carrier was also taken into the calculation in a self-consistent manner.

Tables 1 and 2 show In compositions of the barrier layer and the well layer of the InGaN quantum well structure used for the calculation. The template materials were a C-plane $In_{0.31}Ga_{0.69}N$ template lattice-matched to the (111) spinel single crystal substrate and a previously used C-plane GaN template. In all configurations, the width of the barrier layer was specified to be 6 nm and the width of the well layer was specified to be 3 nm.

The semiconductor lasers are operated under the condition of a high carrier density as compared with the condition of the light-emitting diodes, so that the peak positions of the gain and the spontaneous emission probability may be different and the In compositions may be different between the gain and the spontaneous emission probability even at the same wavelength.

<Gain>

Table 1 shows the contents of the samples subjected to the calculation of the gain. The sample names of the individual InGaN quantum wells formed on the C-plane $In_{0.31}Ga_{0.69}N$ templates were specified to be A-1a to A-4a on a wavelength of gain calculation basis. Likewise, the sample names of the individual InGaN quantum wells formed on the C-plane GaN templates were specified to be A-1b to A-4b. In Table 1, the values in the columns of well layer and barrier layer indicate the In compositions of the individual layers in the quantum well structure. Then, the gain of the quantum well was calculated with respect to each of the emission wavelengths of 530 nm, 550 nm, 575 nm, and 600 nm.

TABLE 1

| | C-plane $In_{0.31}Ga_{0.69}$ N template | | | C-plane GaN template | | |
|---|---|---|---|---|---|---|
| Wavelength | Sample name | Well layer | Barrier layer | Sample name | Well layer | Barrier layer |
| 530 nm | A-1a | 0.31 | 0.20 | A-1b | 0.31 | 0 |
| 550 nm | A-2a | 0.35 | 0.25 | A-2b | 0.34 | 0 |
| 575 nm | A-3a | 0.40 | 0.25 | A-3b | 0.37 | 0 |
| 600 nm | A-4a | 0.44 | 0.31 | A-4b | 0.40 | 0 |

The gain was calculated at a carrier density within the range of $6.3 \times 10^{11}$ cm$^{-2}$ to $1.07 \times 10^{13}$ cm$^{-2}$ which is the operation range of the semiconductor laser.

Figure 2:
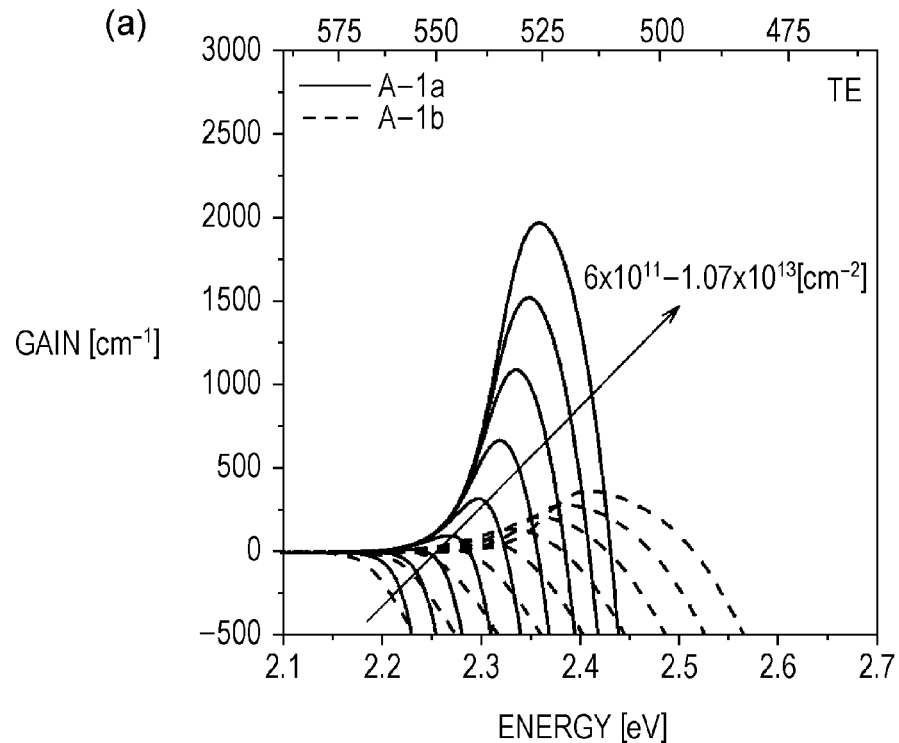
FIG. 2 shows diagrams illustrating the theoretical calculation results of gain spectra.
Figure 2:
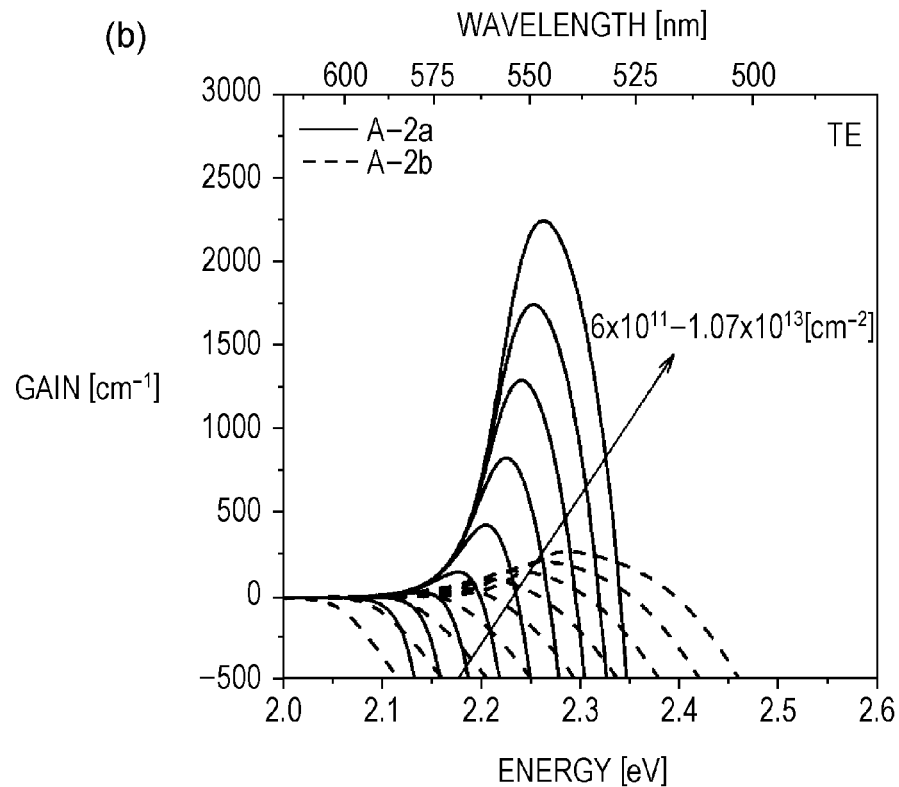
Figure 3:
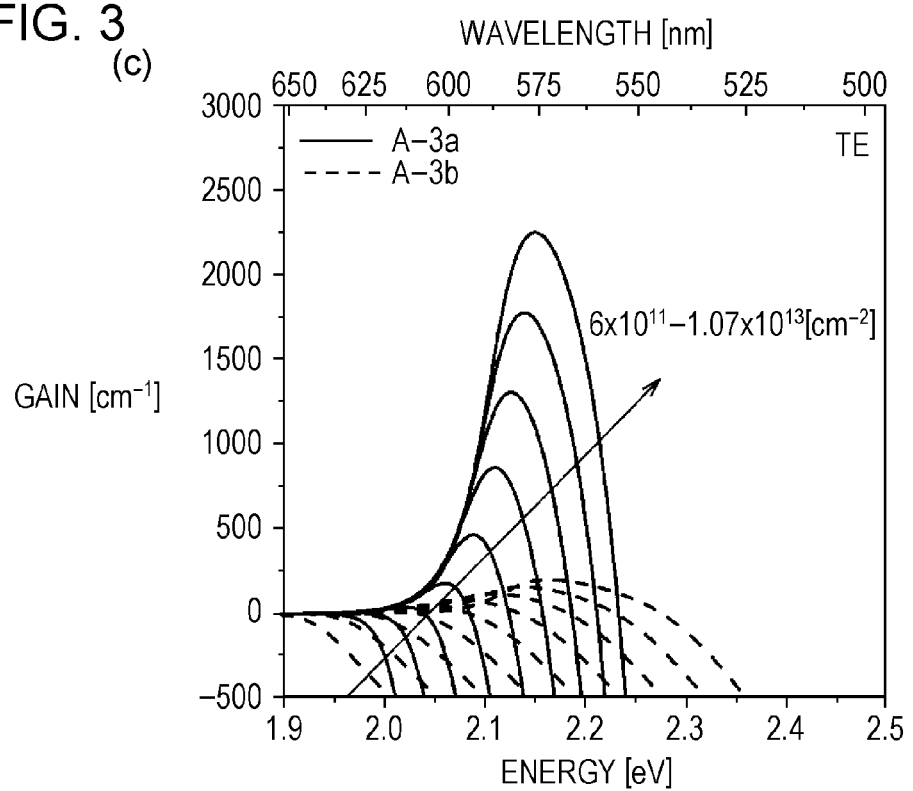
FIG. 3 shows diagrams illustrating the theoretical calculation results of gain spectra.
Figure 3:
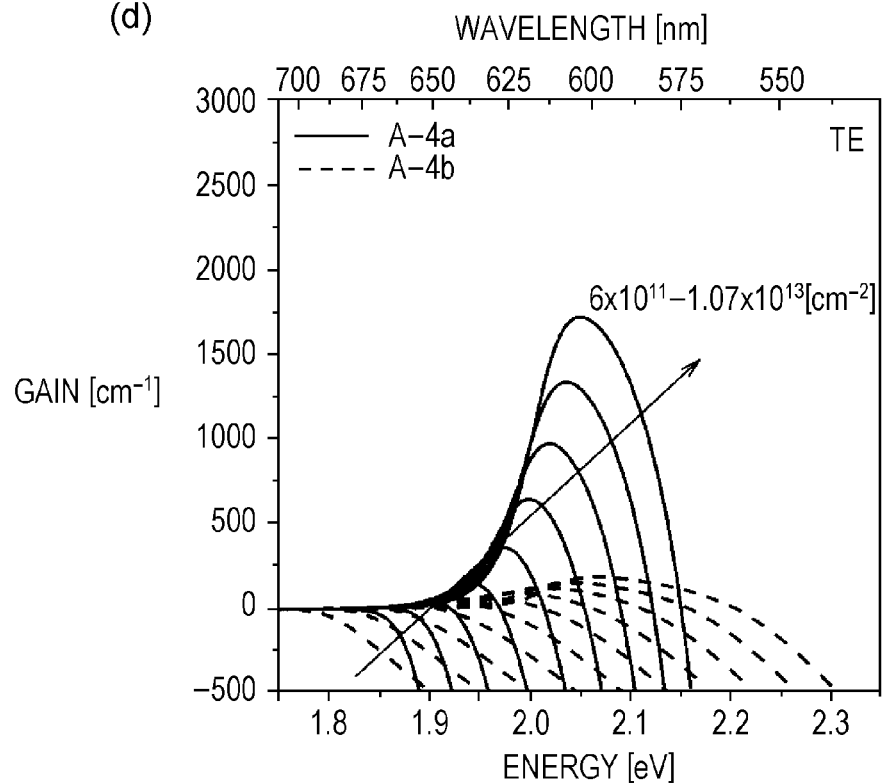

FIG. 2 (a), FIG. 2 (b), FIG. 3 (c), and FIG. 3 (d) show the calculation results of the TE-polarized gain spectra. In this regard, the TE polarization refers to a polarized component in the quantum well in-plain direction. On the other hand, the polarized component in the quantum well growth direction is referred to as TM polarization. It is assumed that the semiconductor laser diode according to the present invention is operated on the basis of the TE polarization and, therefore, hereafter the TE polarization is concerned unless otherwise described with respect to the polarization.

FIG. 2 (a), FIG. 2 (b), FIG. 3 (c), and FIG. 3 (d) show the calculation results of (a) A-1a (solid line) and A-1b (broken line), (b) A-2a (solid line) and A-2b (broken line), (c) A-3a (solid line) and A-3b (broken line), and (d) A-4a (solid line) and A-4b (broken line), respectively. As is clear from FIG. 2 and FIG. 3, each quantum well has a peak in the vicinity of the design wavelength.

Figure 4:
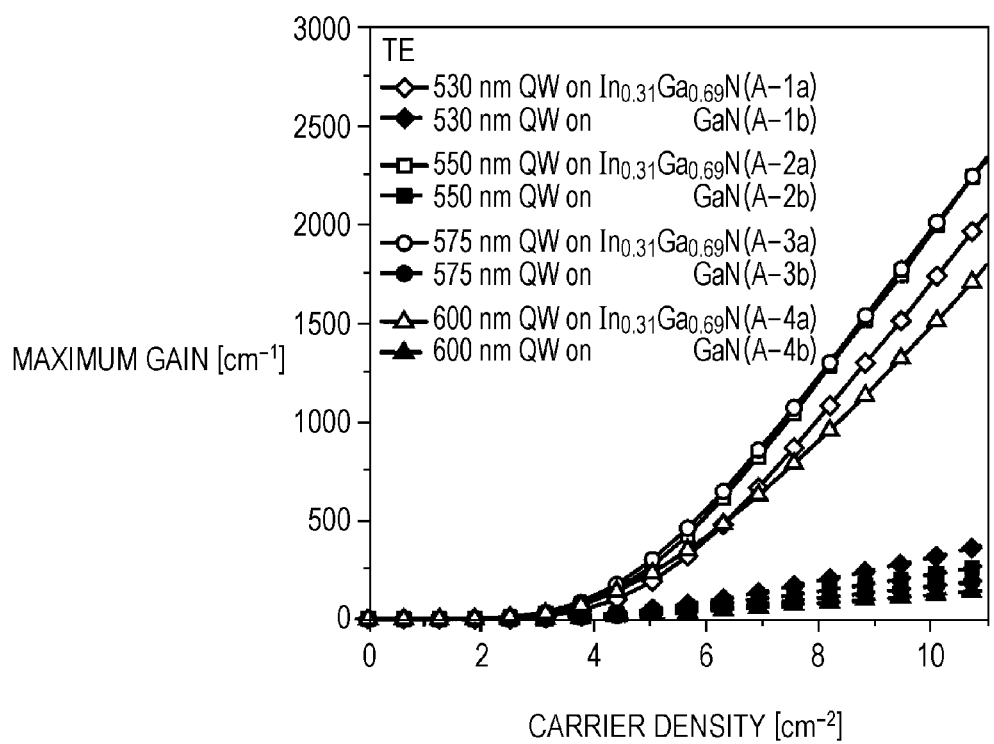
FIG. 4 is a diagram showing the carrier density dependence of the gain peak.

Also, FIG. 4 shows a plot of peak values of the gains. As is clear from FIG. 4, at every wavelength, the InGaN quantum wells formed on the C-plane $In_{0.31}Ga_{0.69}N$ template (that is, A-1a to A-4a) have gains about 2 times to 5 times larger than the gains of the InGaN quantum wells formed on the C-plane GaN template (that is, A-1b to A-4b).

Here, the lasing possibility will be described. Lasing occurs when the gain exceeds the loss of the cavity. As for a typical InGaN quantum well laser, it is considered that a total of the internal loss of the cavity and the mirror loss is about 25 cm$^{-1}$ and the optical confinement factor (proportion of the light overlapping the quantum well active layer to generate a gain in the light confined in the cavity) is about 0.02. That is, [maximum value of gain]×0.02−25>0 is the lasing condition. Consequently, lasing is possible in the case where the maximum value of the gain reaches 1,250 cm$^{-1}$.

In the range of carrier density of $8 \times 10^{12}$ cm$^{-2}$ or more and $9 \times 10^{12}$ cm$^{-2}$ or less, each of A-1a to A-4a is more than 1,250 cm$^{-1}$ and, therefore, lasing is possible.

<Spontaneous Emission Probability>

Table 2 shows the contents of the samples subjected to the calculation of the spontaneous emission probability. The sample names of the individual InGaN quantum wells formed on the C-plane $In_{0.31}Ga_{0.69}N$ templates were specified to be B-1a to B-3a on a wavelength of spontaneous emission probability calculation basis. Likewise, the sample names of the individual InGaN quantum wells formed on the C-plane GaN templates were specified to be B-1b to B-3b. In Table 2, the values in the columns of well layer and barrier layer indicate the In compositions of the individual layers in the quantum well structure. Then, the spontaneous emission probability of the quantum well was calculated with respect to each of 550 nm, 575 nm, and 600 nm.

TABLE 2

| | C-plane $In_{0.31}Ga_{0.69}$ N template | | | C-plane GaN template | | |
|---|---|---|---|---|---|---|
| Wavelength | Sample name | Well layer | Barrier layer | Sample name | Well layer | Barrier layer |
| 550 nm | B-1a | 0.32 | 0.25 | B-1b | 0.31 | 0 |
| 575 nm | B-2a | 0.36 | 0.25 | B-2b | 0.33 | 0 |
| 600 nm | B-3a | 0.40 | 0.31 | B-3b | 0.35 | 0 |

The spontaneous emission probability was calculated at a carrier density within the range of $6.3 \times 10^{11}$ cm$^{-2}$ to $3.2 \times 10^{12}$ cm$^{-2}$ which is the operation range of the light-emitting diode.

Figure 5:
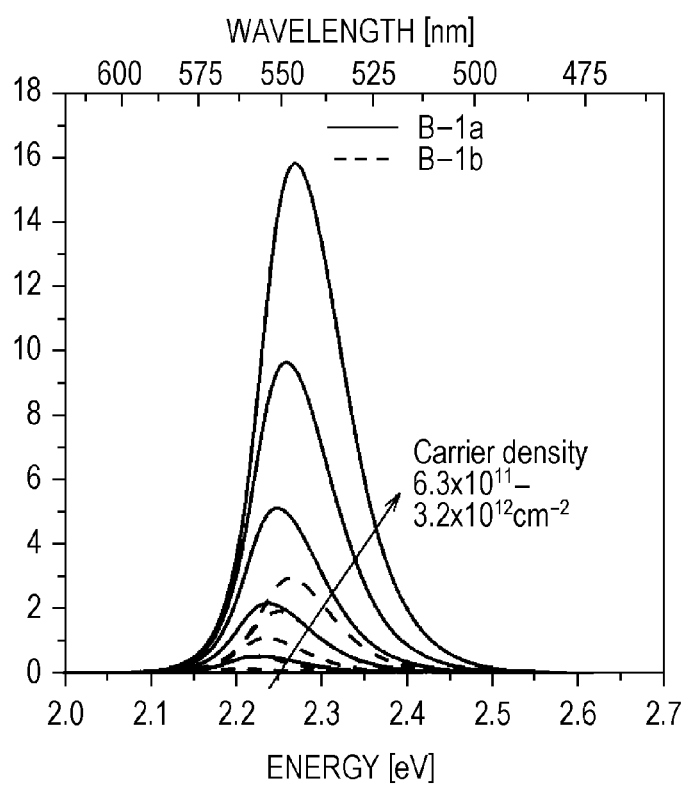
FIG. 5 shows diagrams illustrating the theoretical calculation results of the spontaneous emission probability.
Figure 5:
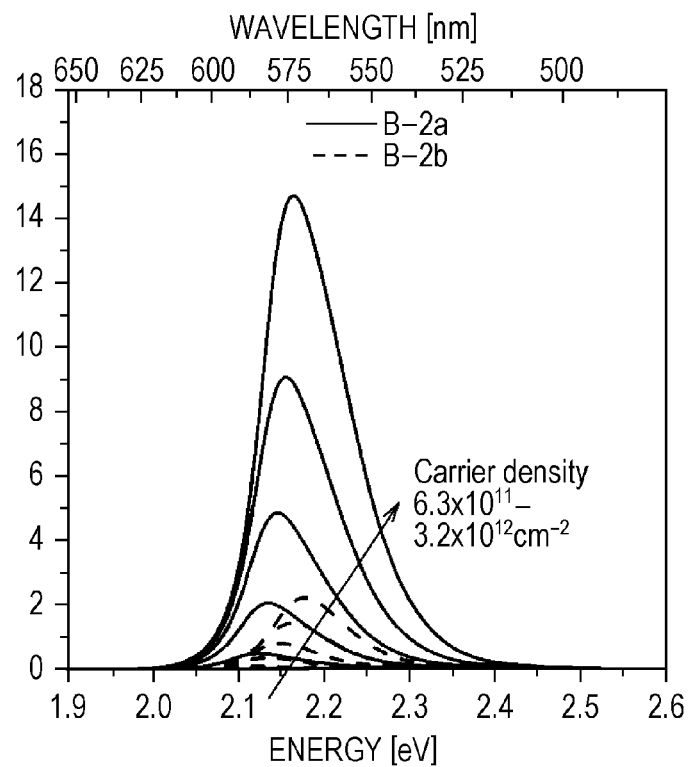
Figure 6:
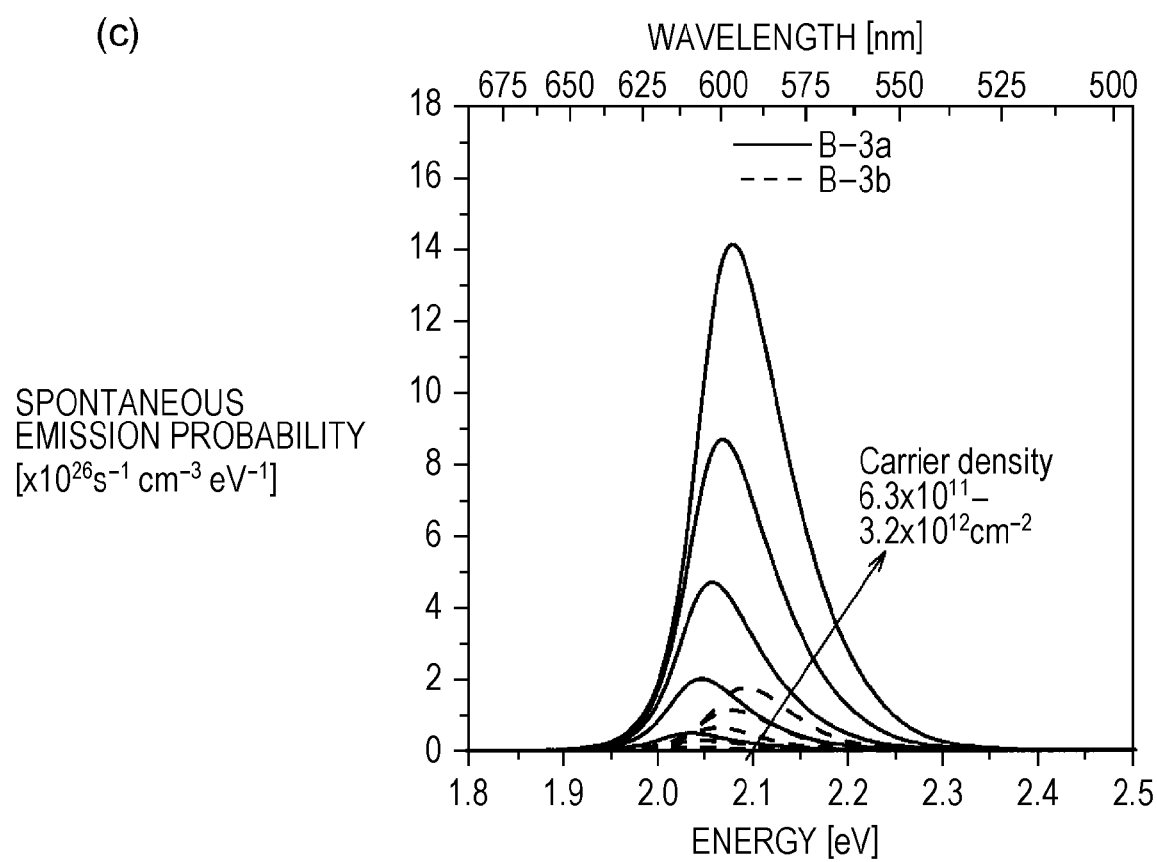
FIG. 6 shows a diagram illustrating the theoretical calculation results of the spontaneous emission probability.

FIG. 5 (a), FIG. 5 (b), and FIG. 6 (c) show the calculation results of the spontaneous emission spectra, where the carrier density was changed from $6 \times 10^{11}$ cm$^{-2}$ to $3 \times 10^{12}$ cm$^{-2}$. In (a) to (c), the results of (a) B-1a (solid line) and B-1b (broken line), (b) B-2a (solid line) and B-2b (broken line), and (c) B-3a (solid line) and B-3b (broken line), respectively, are shown. As is clear from FIG. 5 and FIG. 6, each quantum well has a peak in the vicinity of the design wavelength.

Figure 7:
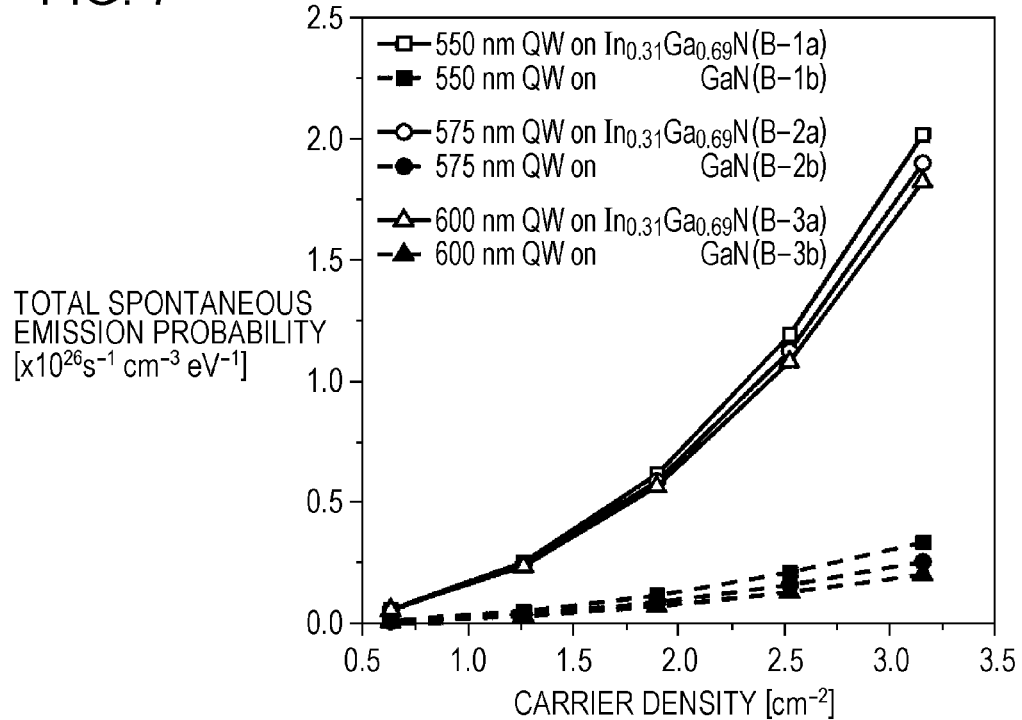
FIG. 7 is a diagram showing the carrier density dependence of the spontaneous emission probability.

Also, FIG. 7 shows a plot of total spontaneous emission probability. As is clear from FIG. 7, at every wavelength, the InGaN quantum wells formed on the C-plane $In_{0.31}Ga_{0.69}N$ template (that is, B-1a to B-3a) have spontaneous emission probabilities about 4 times to 5 times larger than the spontaneous emission probabilities of the InGaN quantum wells formed on the C-plane GaN template (that is, B-1b to B-3b). That is, the luminous efficacy exhibited is 4 times to 5 times larger.

<Influence of in Composition>

Here, differences between calculation results of the individual InGaN quantum wells formed on the C-plane $In_{0.31}Ga_{0.69}N$ template will be described. As shown in FIG. 4, under each of the conditions in which the carrier densities are constant at predetermined values, A-3a shows the largest value of the maximum gains. The reason thereof will be described below with reference to FIG. 8.

In the case where a lattice mismatch to a substrate is present in $In_{(X)}Ga_{(1-X)}N$ (0<X<1) epitaxially grown on the substrate, a biaxial stress is generated in the in-plane direction of growth. Positions of atoms in a crystal are changed by this biaxial stress, so that an energy structure is changed.

A specific method for deriving an amount of change of the band gap with respect to strain is shown in, for example, "Chuang et al." described above. Such a method was used and the band gap of the $In_{(X)}Ga_{(1-X)}N$ (0<X<1) thin film formed on the $In_{0.31}Ga_{0.69}N$ template lattice-matched to the (111) spinel ($MgAl_2O_4$) substrate was calculated. The results are shown in FIG. 8.

In this regard, in the calculation of the band gap, one conduction band (Ec) and three valence bands (Ehh, Elh, and Ech) were considered. The three valence bands are referred to as a heavy hole band (Ehh), a light hole band (Elh), and a crystal field splitting band (Ech) and the properties thereof are different from each other. The band gaps shown in FIG. 8 are defined as the differences between the above-described Ec and each of the above-described Ehh, Elh, and Ech. Hereafter these band gaps may be referred to as [Ec-Elh], [Ec-Ehh], and [Ec-Ech].

Here, transition between the conduction band and the heavy hole and transition between the conduction band and the light hole emit light of the TE polarization and transition between the conduction band and the crystal field splitting band emits light of TM polarization.

Figure 8:
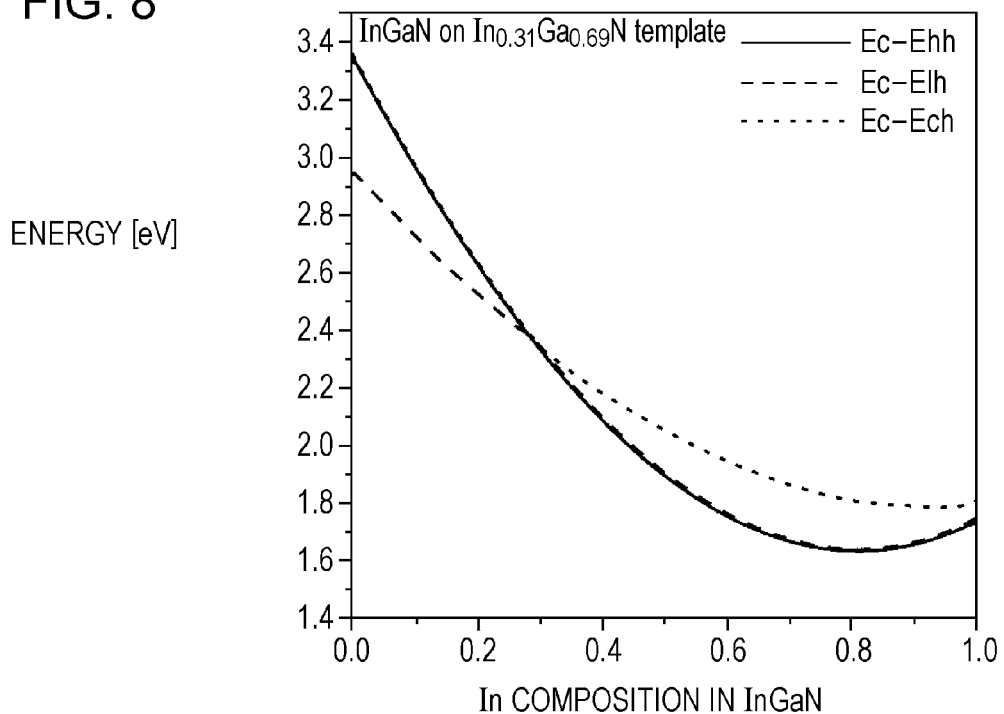
FIG. 8 is a diagram showing the relationship between the In composition in the InGaN semiconductor element and the band gap.

As shown in FIG. 8, in the region of X<0.8, the band gap decreases as the In composition increases. Then, the smallest band gap is switched from [Ec-Elh] to [Ec-Ehh], where the boundary is a point in the vicinity of X=0.28.

This is because AlInGaN is a direct transition transistor and, therefore, optical transition occurs most strongly at energy near the band, that is, because transition between the conduction band and the valence band constituting the band gap serves as a main optical transition mechanism.

However, in a region, in which the difference between the In compositions of the InGaN template and the well layer is relatively small, in the vicinity of X=0.31, the energy levels of three types of bands are close to each other, so that the individual bands are in the state of being mixed with each other (this state may be referred to as band mixing). Consequently, transitions between the individual bands of [Ec-Elh], [Ec-Ehh], and [Ec-Ech] are mixed with each other and the light based on mixing of the TE polarization and the TM polarization is emitted.

In this regard, the number of carriers is constant, so that if an optical transition of [Ec-Ech] to generate TM polarization occurs, optical transitions of [Ec-Elh] and [Ec-Ehh] to generate TE polarization are reduced correspondingly. Furthermore, if a difference in In composition increases, the proportion of the TM polarization decreases and, thereby, the gain of TE polarization increases. As a result of the calculation, it was found that in the case where X≥0.36, that is, a difference in In composition (Y2−X0) between the $In_{(X0)}Ga_{(1-X0)}N$ template and the $Al_{(X2)}In_{(Y2)}Ga_{(1-X2-Y2)}N$ well layer was 0.05 or more, the TM-polarized component became almost negligibly small. Therefore, it is favorable that the relationship of 0.05≤Y2−X0 is satisfied.

On the other hand, in the region of X>0.31, strain increases as the In composition increases, so that a piezoelectric field increases. As described above, the piezoelectric field spatially separates the electron from the hole, so that the radiative recombination probability is lowered and the gain is reduced. However, in the region in which the piezoelectric field is small, the piezoelectric field is canceled by an electric field generated by the carrier in itself. Consequently, spatial separation of the electron from the hole due to piezoelectric field is relaxed, so that lowering of the radiative recombination probability does not occur.

However, in a region in which the In composition is increased to more than this, the carriers cannot generate an electric field sufficient for canceling the piezoelectric field because of the influence of screening, and the above-described relaxation of spatial separation of the electron from the hole does not occur.

Therefore, in the region of X>0.31, a factor (influence of crystal field splitting band) to increase and a factor (piezoelectric field) to decrease the TE polarization gain along with an increase in X are present and an influence of the screening is added to both factors, so that when a difference in In composition (Y2−X0) between the $In_{(X0)}Ga_{(1-X0)}N$ template and the $Al_{(X2)}In_{(Y2)}Ga_{(1-X2-Y2)}N$ well layer is 0.10 (Sample A-3a), the gain becomes maximum.

If the difference in In composition (Y2−X0) between the $In_{(X0)}Ga_{(1-X0)}N$ template and the $Al_{(X2)}In_{(Y2)}Ga_{(1-X2-Y2)}N$ well layer is larger than 0.10, the influence of the piezoelectric field becomes considerable. Consequently, the gain and the spontaneous emission probability of Sample A-4a are reduced. Therefore, it is favorable that the relationship of Y2−X0≤0.10 is satisfied.

The light-emitting diode has a carrier density in the operation state lower than the carrier density of the semiconductor laser diode, so that the above-described effect of screening is small. Therefore, the influence of the piezoelectric field is relatively large, so that, as shown in FIG. 7, the spontaneous emission probability becomes a maximum value at the composition of Sample B-1a and decreases along with an increase in the In composition.

Up to this point, factors of the changes have been mentioned on the basis of comparison of templates having the same gain and spontaneous emission probability. The largest cause of occurrences of the energy difference between the three types of valence bands and the piezoelectric field is the strain. The influences exerted by the strain on the individual valence band energy are different from each other and the amounts of change in the energy value due to the strain of the individual valence bands do not take on the same value. Therefore, the above-described differences in the characteristics occur.

In this regard, the explanation has been made with reference to the InGaN quantum well as an example, although $Al_{(X)}In_{(Y)}Ga_{(1-X-Y)}N$ exhibits the same tendency.

As described above, it was ascertained that in a region of wavelengths longer than the wavelength of green, the gain and the spontaneous emission probability were improved at the same time and a semiconductor laser diode allowed to lase was able to be realized by employing the configuration of the semiconductor laser diode 1 in the first embodiment, that is, including the $In_{(X0)}Ga_{(1-X0)}N$ (0.25≤X0≤0.35) template and the $Al_{(X2)}In_{(Y2)}Ga_{(1-X2-Y2)}N$ (0≤X2≤1, 0≤Y2≤1) quantum well active layer serving as the well layer.

Furthermore, it was made clear that in the case where the $In_{(X0)}Ga_{(1-X0)}N$ (0.25≤X0≤0.35) template was the C-plane $In_{0.31}Ga_{0.69}N$ template, particularly excellent performance was exhibited.

Meanwhile, as described above, the InGaN quantum well formed on the $In_{0.31}Ga_{0.69}N$ template exhibits very high characteristics as compared with the InGaN quantum well formed on the GaN template because the difference in the In composition from the In composition of the template lattice-matched to the well layer falls within a small range.

The magnitude of the piezoelectric field is determined by the difference in the In composition between the well layer and the template, and the piezoelectric field increases as the difference in the In composition increases. Therefore, in comparison with the C-plane GaN template used in NPL 1 and the lattice-matched InGaN template having an In composition of 0.1 to 0.2 used in PTL 1, in the case where at least the In composition is larger than 0.31, that is, with respect to the light-emitting elements with wavelengths longer than the wavelength of green, a light-emitting element exhibiting very excellent performance can be realized. That is, an effect of improving the light-emitting characteristics is not limited to only the structure shown in Table 1.

Second Embodiment

Next, a light-emitting diode 2 which is a second embodiment will be described. In this regard, in the explanations below, configurations which play the same roles as those in the first embodiment are indicated by the same reference numerals and the explanations will not be provided.

<Element Configuration>

The configuration of the light-emitting diode 2 will be described with reference to FIG. 10. The light-emitting diode 2 includes a (111) spinel single crystal substrate 10, an InGaN template 11 which is formed on the spinel single crystal substrate 10 and which has an In composition lattice-matched to the spinel single crystal substrate 10, a lower contact layer 12 which is formed on the InGaN template 11 and which contains AlInGaN lattice-matched to the InGaN template 11, a lower clad layer 13 which is formed on the lower contact layer 12 and which contains AlInGaN, an AlInGaN quantum well active layer 15 formed on the lower clad layer 13, an upper clad layer 18 which is formed on the quantum well active layer 15 and which contains AlInGaN, and an upper contact layer 19 which is formed on the upper clad layer 18 and which contains AlInGaN.

The roles and the compositions of the individual layers in the second embodiment (light-emitting diode 2) are the same as those in the first embodiment (semiconductor laser diode 1). Also, the method for manufacturing an epitaxial wafer in the second embodiment is the same as the manufacturing method in the first embodiment. However, it is shown that formation of the layers which are included in the semiconductor laser diode 1 in the first embodiment and which are not included in the light-emitting diode 2 (for example, the lower guide layer 14) is omitted from the manufacturing method in the first embodiment.

<Back End Processes>

Figure 10:
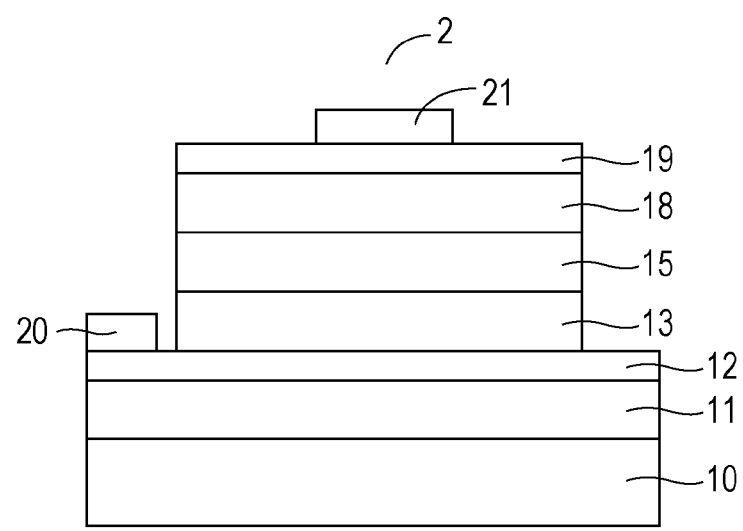
FIG. 10 is a schematic conceptual diagram of a light-emitting diode according to the present invention.

With respect to the epitaxial wafer of the light-emitting diode 2, as shown in FIG. 10, selective etching is performed to expose the surface of the lower contact layer 12, and an n-electrode 20 and a p-electrode 21 are formed on the exposed lower contact layer 12 and the upper contact layer 19 surface, respectively. Subsequently, the (111) spinel single crystal substrate 10 side of the wafer is cut into a chip of 350 μm×350 μm by using a dicer or a slicer, so that the light-emitting diode 2 is formed.

In the light-emitting diode in the second embodiment, as with the semiconductor laser diode in the first embodiment, the InGaN quantum well formed on the C-plane $In_{0.31}Ga_{0.69}N$ template is used and, thereby, a highly efficient light-emitting diode can be formed, wherein the gain and the spontaneous emission probability are improved at the same time, in a region of wavelengths longer than the wavelength of green.

Up to this point, the embodiments according to the present invention have been explained, and appropriate combinations of the above-described configurations of the individual embodiments and examples are expected originally.

It is to be understood that all points of the embodiments disclosed above are no more than examples and are not limitative. The scope of the present invention is to be determined by the claims rather than the above-described explanations and is designed to include all modifications within the spirit and scope equivalent to the claims.

REFERENCE SIGNS LIST 1 semiconductor laser diode
2 light-emitting diode
10 spinel single crystal substrate
11 template
12 lower contact layer
13 lower clad layer
14 lower guide layer
15 quantum well active layer
16 current blocking layer
17 upper guide layer
18 upper clad layer
19 upper contact layer
20 n-electrode
21 p-electrode
22 insulating film
23 reflection mirror
151 well layer
152 barrier layer

The invention claimed is:

1. A semiconductor light-emitting element comprising:
an $In_{(X0)}Ga_{(1-X0)}N$ (0.25≤X0≤0.35) template; and
a quantum well active layer containing $Al_{(X2)}In_{(Y2)}Ga_{(1-X2-Y2)}N$ (0≤X2≤1, 0≤Y2≤1) as a well layer, wherein
the template includes a (111) spinel substrate or an $In_{(X0)}Ga_{(1-X0)}N$ (0.25≤X0≤0.35) single crystal substrate as a base and, in addition, includes an $In_{(X0)}Ga_{(1-X0)}N$ (0.25≤X0≤0.35) layer lattice-matched to the substrate; and
a film thickness of the $In_{(X0)}Ga_{(1-X0)}N$ (0.25≤X0≤0.35) template is 0.5 μm or more.

2. The semiconductor light-emitting element according to claim 1, further comprising:
an $Al_{(X1)}In_{(Y1)}Ga_{(1-X1-Y1)}N$ (0≤X1≤1, 0≤Y1≤1) lower clad layer lattice-matched to the template between the template and the quantum well active layer; and
an $Al_{(X3)}In_{(Y3)}Ga_{(1-X3-Y3)}N$ (0≤X3≤1, 0≤Y3≤1) upper clad layer lattice-matched to the template on the quantum well active layer.

3. The semiconductor light-emitting element according to claim 1 wherein the X0 satisfies the relationship of 0.30≤X0≤0.32.

4. The semiconductor light-emitting element according to claim 1, wherein the X0 and the Y2 satisfy the relationship of $0.05 \leq Y2-X0$.

5. The semiconductor light-emitting element according to claim 1, wherein the X0 and the Y2 satisfy the relationship of $Y2-X0 \leq 0.10$.

6. The semiconductor light-emitting element according to claim 1, comprising:
- an $Al_{(X4)}In_{(Y4)}Ga_{(1-X4-Y4)}N$ ($0 \leq X4 \leq 1$, $0 \leq Y4 \leq 1$) lower contact layer lattice-matched to the template between the template and a lower clad layer;
- an $Al_{(X5)}In_{(Y5)}Ga_{(1-X5-Y5)}N$ ($0 \leq X5 \leq 1$, $0 \leq Y5 \leq 1$) lower guide layer between the lower clad layer and the quantum well active layer; and
- an $Al_{(X6)}In_{(Y6)}Ga_{(1-X6-Y6)}N$ ($0 \leq X6 \leq 1$, $0 \leq Y6 \leq 1$) upper current blocking layer and an $Al_{(X7)}In_{(Y7)}Ga_{(1-X7-Y7)}N$ ($0 \leq X7 \leq 1$, $0 \leq Y7 \leq 1$) upper guide layer between the quantum well active layer and an upper clad layer, wherein an $Al_{(X8)}In_{(Y8)}Ga_{(1-X8-Y8)}N$ ($0 \leq X8 \leq 1$, $0 \leq Y8 \leq 1$) upper contact layer is included on the upper clad layer.

* * * * *